US009410996B2

(12) United States Patent
Du et al.

(10) Patent No.: US 9,410,996 B2
(45) Date of Patent: Aug. 9, 2016

(54) METHOD AND SYSTEM EMPLOYING FINITE STATE MACHINE MODELING TO IDENTIFY ONE OF A PLURALITY OF DIFFERENT ELECTRIC LOAD TYPES

(71) Applicants: EATON CORPORATION, Cleveland, OH (US); GEORGIA TECH RESEARCH CORPORATION, Atlanta, GA (US)

(72) Inventors: Liang Du, Atlanta, GA (US); Yi Yang, Milwaukee, WI (US); Ronald Gordon Harley, Lawrenceville, GA (US); Thomas G. Habetler, Snellville, GA (US); Dawei He, Beijing (CN)

(73) Assignee: EATON CORPORATION, Cleveland, OH (US)

( * ) Notice: Subject to any disclaimer, the term of this patent is extended or adjusted under 35 U.S.C. 154(b) by 562 days.

(21) Appl. No.: 13/908,263

(22) Filed: Jun. 3, 2013

(65) Prior Publication Data
US 2014/0358456 A1 Dec. 4, 2014

(51) Int. Cl.
*G01R 21/06* (2006.01)
*G01R 19/00* (2006.01)
*G01D 4/00* (2006.01)

(52) U.S. Cl.
CPC ............... *G01R 21/06* (2013.01); *G01D 4/004* (2013.01); *G01R 19/00* (2013.01); *Y02B 90/242* (2013.01); *Y04S 20/322* (2013.01); *Y04S 20/38* (2013.01)

(58) Field of Classification Search
CPC ....... G06N 3/088; G01D 4/004; G01R 19/00; G01R 21/06; Y04S 20/38
USPC ............ 702/60, 64; 323/273; 324/76.12, 521; 361/78; 707/737, 748, 757
See application file for complete search history.

(56) References Cited

U.S. PATENT DOCUMENTS

| 4,858,141 A | 8/1989 | Hart et al. |
| 5,483,153 A | 1/1996 | Leeb et al. |

(Continued)

FOREIGN PATENT DOCUMENTS

| GB | 2465367 A | 5/2010 |
| WO | 2006/067665 A1 | 6/2006 |
| WO | 2010/005985 A1 | 1/2010 |

OTHER PUBLICATIONS

European Patent Office, "International Search Report and Written Opinion", Sep. 19, 2014, 9 pp.
A. Bouloutas et al., "Fault Identification Using a Finite State Machine Model with Unreliable Partially Observed Data Sequences", IEEE Transactions on Communications, vol. 41, No. 7, Jul. 1993, pp. 1074-1083.

(Continued)

*Primary Examiner* — John H Le
(74) *Attorney, Agent, or Firm* — Eckert Seamans Cherin & Mellott, LLC; Grant E. Coffield; Nathaniel C. Wilks

(57) ABSTRACT

A system is for a plurality of different electric load types. The system includes a plurality of sensors structured to sense a voltage signal and a current signal for each of the different electric loads; and a processor. The processor acquires a voltage and current waveform from the sensors for a corresponding one of the different electric load types; calculates a power or current RMS profile of the waveform; quantizes the power or current RMS profile into a set of quantized state-values; evaluates a state-duration for each of the quantized state-values; evaluates a plurality of state-types based on the power or current RMS profile and the quantized state-values; generates a state-sequence that describes a corresponding finite state machine model of a generalized load start-up or transient profile for the corresponding electric load type; and identifies the corresponding electric load type.

24 Claims, 15 Drawing Sheets

(56) References Cited

U.S. PATENT DOCUMENTS

| | | | |
|---|---|---|---|
| 5,717,325 | A | 2/1998 | Leeb et al. |
| 5,910,875 | A | 6/1999 | Tian et al. |
| 6,081,123 | A | 6/2000 | Kasbarian et al. |
| 7,679,345 | B1 | 3/2010 | Shwetabh et al. |
| 2009/0072985 | A1 | 3/2009 | Patel et al. |
| 2013/0138651 | A1* | 5/2013 | Lu .................... G06N 3/088 707/737 |
| 2013/0138661 | A1 | 5/2013 | Lu et al. |
| 2013/0138669 | A1 | 5/2013 | Lu et al. |

OTHER PUBLICATIONS

G. Hart et al., "Correcting Dependent Errors in Sequences Generated by Finite-State Processes", IEEE Transactions on Information Theory, vol. 39, No. 4, Jul. 1993, pp. 1249-1260.

Y. Du et al., "A Review of Identification and Monitoring Methods for Electric Loads in Commercial and Residential Buildings", Proc. 2010 IEEE Energy Conversion Conf. and Expo., Atlanta, GA, 2010, pp. 4527-4533.

* cited by examiner

METHOD AND SYSTEM EMPLOYING FINITE STATE MACHINE MODELING TO IDENTIFY ONE OF A PLURALITY OF DIFFERENT ELECTRIC LOAD TYPES

This invention was made with Government support under DE-EE0003911 awarded by the Department of Energy National Energy Technology Laboratory. The Government has certain rights in this invention.

BACKGROUND

1. Field

The disclosed concept pertains generally to electric loads and, more particularly, to methods of identifying different types of electric loads. The disclosed concept also pertains to systems for identifying different types of electric loads.

2. Background Information

In commercial or residential buildings, the use of plug-in loads accounts for about 36% of the total building electricity consumption. Effective management of plug-in loads can help users obtain energy saving potentials up to about 7% to about 15% of total building energy consumption. However, power consumption monitoring and energy management of plug-in loads inside buildings is often overlooked. Existing plug-in load control and management products (e.g., controllable power strips) are not considered to be effective solutions, since often-observed nuisance trips cause inconvenience to users and potential damage to appliances, and consequently downgrade the compliance rate of adopted solutions. One of the main reasons that cause such issues is the lack of visibility to the actual use status of the plug-in loads.

In order to obtain effective control and management of plug-in loads, as well as to ensure persistent energy conservation measures, building facility managers and end users have recognized the need to be aware of the types and operating status of plug-in loads being used inside buildings. In other words, finer granular visibility on energy usage of plug-in loads by load types is desired.

U.S. Patent Application Pub. No. 2013/0138669, entitled: "System And Method Employing A Hierarchical Load Feature Database To Identify Electric Load Types Of Different Electric Loads", which is incorporated by reference herein, discloses a system and method that employs a hierarchical load feature database and classification structure as model-driven guidance for optimized feature selections.

There is room for improvement in methods of identifying different electric load types.

There is also room for improvement in systems for identifying different electric load types.

SUMMARY

These needs and others are met by embodiments of the disclosed concept which generate a state-sequence that describes a corresponding finite state machine model of a generalized load start-up or transient profile for a corresponding one of different electric load types; and identify the corresponding one of the different electric load types.

In accordance with one aspect of the disclosed concept, a system for a plurality of different electric load types comprises: a plurality of sensors structured to sense a voltage signal and a current signal for each of the different electric loads; and a processor structured to: acquire a voltage and current waveform from the sensors for a corresponding one of the different electric load types; calculate a power or current RMS profile of the waveform; quantize the power or current RMS profile into a set of quantized state-values; evaluate a state-duration for each of the quantized state-values; evaluate a plurality of state-types based on the power or current RMS profile and the quantized state-values; generate a state-sequence that describes a corresponding finite state machine model of a generalized load start-up or transient profile for the corresponding one of the different electric load types; and identify the corresponding one of the different electric load types.

As another aspect of the disclosed concept, a finite state machine modeling method for a plurality of different electric load types comprises: acquiring a voltage and current waveform of a corresponding one of the different electric load types; calculating a power or current RMS profile of the waveform; quantizing the power or current RMS profile into a set of quantized state-values; evaluating a state-duration for each of the quantized state-values; evaluating a plurality of state-types based on the power or current RMS profile and the quantized state-values; generating by a processor a state-sequence that describes a corresponding finite state machine model of a generalized load start-up or transient profile for the corresponding one of the different electric load types; and identifying the corresponding one of the different electric load types.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
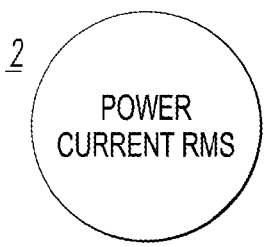
FIG. 1 is a block diagram of a state employed to model load profiles in accordance with embodiments of the disclosed concept.

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer (PC); a controller; a digital signal processor (DSP); a microprocessor; a microcontroller; a microcomputer; a central processing unit; a mainframe computer; a mini-computer; a server; a networked processor; or any suitable processing device or apparatus.

The disclosed concept is described in association with example loads and example load features, although the disclosed concept is applicable to a wide range of loads and a wide range of load features.

The disclosed concept enables an automatic identification technology for plug-in loads and can address a Level-2 load sub-category identification as disclosed by Pub. No. 2013/0138669. A hierarchical load feature database comprises three layers, although more than three layers can be employed. The first layer or level is the load category, the second layer or level (Level-2) is the load sub-category, and the third layer or level is the load type, which includes a plurality of different load types.

Non-limiting examples of load categories of the first level include resistive loads, reactive loads, nonlinear with power factor correction, nonlinear without power factor correction, nonlinear with transformer, nonlinear with phase angle control, and complex structure.

Non-limiting examples of load sub-categories of the second level include resistive loads, such as lighting tools, kitchen appliances and personal care appliances; reactive loads, such as linear reactive loads and nonlinear with machine saturations; nonlinear with power factor correction, such as large monitors, television equipment and other large consumer electronic devices; nonlinear without power factor correction, such as imaging equipment, small monitors and televisions, personal computers (PCs), electronic loads with a battery charger, lighting loads and other small electronic devices; nonlinear with transformer, such as small electronics without a battery charger and others with a battery charger; and complex structures, such as a microwave oven.

A few non-limiting examples of load types of the third level are incandescent lamps (<100 W) for lighting tools, and a bread toaster, a space heater and other appliances for kitchen and personal care appliances.

Automatic identification for plug-in loads has been considered to be a challenging task. One of the major reasons is that these types of loads, for example, particularly office appliances and PCs, often share very similar steady-state characteristics, since they often share similar front-end electronic topologies and/or are powered by standardized DC power. This kind of similarity presents difficulty in obtaining a meaningful load identification solution for these types of loads through existing methods based on steady-state feature analysis.

Plug-in loads (e.g., without limitation, office appliances and electronic devices) are, however, all designed to implement a specific function to end-users. The loads of the same type (or functional type) share similar operating principles, which are closely associated to how the components inside a load collaborate or interact with each other for a particular functionality. The operating principles of various loads help to define the load profile during start-up, and/or determine when the load is in a particular functional state. The start-up profiles of plug-in loads can be used to distinguish the loads in a finer granularity.

For example, when comparing current versus time waveforms of different types of loads (e.g., without limitation, desktop PCs; LCD televisions; scanners), the steady-state current waveforms (as taken over a relatively few number of power line cycles) are almost the same among such types of loads. However, their start-up profiles (e.g., as measured over tens of seconds or a number of minutes) show distinct differences from one to another. Similarly, office appliances and PCs of the same type share similar operating behaviors of current versus time profiles during start-up (e.g., start-up of laptops from different vendors; start-up of LCD monitors from different vendors; start-up of printers from different vendors during the copying process). This observed commonality among the plug-in loads of the same type is mainly because the components inside such loads of the same type collaborate with each other for the particular functionality in a similar way, or in other words, they share similar operating principles.

Various prior proposals for load identification have utilized load start-up transient information over a relatively few number of power line cycles (e.g., without limitation, $\frac{1}{60}$ second per cycle in the United States). It is believed that most of the existing approaches detect steady power level transitions or high frequency harmonic components during such a start-up transient period. However, it is believed that the detected information is never associated with the operating principle of the particular load type, and presents difficulties to be generalized to the larger scale of the load set in a real-world environment.

The disclosed concept applies a finite state machine (FSM) to describe a generalized load start-up/transient profile of a load type based on its inherent operating principles. The FSM usually consists of a finite number of states, a set of actions, and a set of state transitions between states. A state transition is an action that starts from one state and ends in another state. If the start state and the end state are the same, it is then called a self-state transition. A state transition is triggered by a pre-defined event or a condition.

FIG. 1 shows the concept of a state 2, which is employed when modeling a load profile. A state can be featured by, but not limited to, current peak value, current RMS, instantaneous power consumption, V-I trajectory features, and/or any suitable power-quality related features (e.g., without limitation, current harmonics; current-voltage phase angle).

When modeling a start-up transient of a plug-in load by using FSM, a start-state is normally defined. For example and without limitation, the power consumption or current RMS is considered as the state feature, and the OFF/standby status of the load can be designated as a start-state by a threshold of power consumption less than 5 W, or current RMS less than 0.1 A.

In order to model a long-term load profile versus time by FSM, there are several principles including: (1) the FSM model starts from an OFF/standby mode (i.e., a start-state); (2) voltage and current waveforms are analyzed on a cycle-by-cycle basis in real-time, and are compared with a previous number of cycles; (3) if a change in current RMS (or power consumption) between two adjacent cycles is less than 10% (or any suitable predetermined percentage or difference), then the two adjacent cycles are considered to be in the same state; (4) if a change in current RMS (or power consumption) between two adjacent cycles is larger than 10% (or any suitable predetermined percentage or difference), then the current cycle is designated to be in a new state; and (5) the state-value is the instantaneous current RMS of the first cycle that enters the current state. The number of cycles for how long the current state persists is the state-duration.

For plug-in load FSM-modeling, five types of states are defined as follows: (1) steady-state: if the FSM stays at a certain state for at least five seconds (or any suitable predetermined time); (2) semi-steady-state: if the FSM stays at a certain state for at least one second (or any suitable predetermined time), but less than five seconds (or any suitable predetermined time); (3) spikes: if the power level of the current cycle is greater than 1.85 (or any suitable predetermined value) times the power level of the previous cycle, remains in the high value for only one or two more cycles (or any suitable predetermined time), and then jumps back to a low power level; (4) step-rising-state (or stepR-state): if the power level rises to a high value that is greater than 1.85 (or any suitable predetermined value) times the power level before rising further within one or two cycles (or any suitable predetermined time), and remains at the high value for more than one second (or any suitable predetermined time); and (5) intermittent-state (inter-state): the undefined states between any of the above-defined states; this normally represents rather frequent state-changes with relatively small variance in magnitudes and relatively short state-durations (i.e., less than 1 second (or any suitable predetermined time)). Steady-states and semi-steady-states are usually the states that define the major trend of a load profile. The spikes, stepR-states, and inter-states are the short-term states that describe power fluctuations and short-term transitions.

Figure 2:
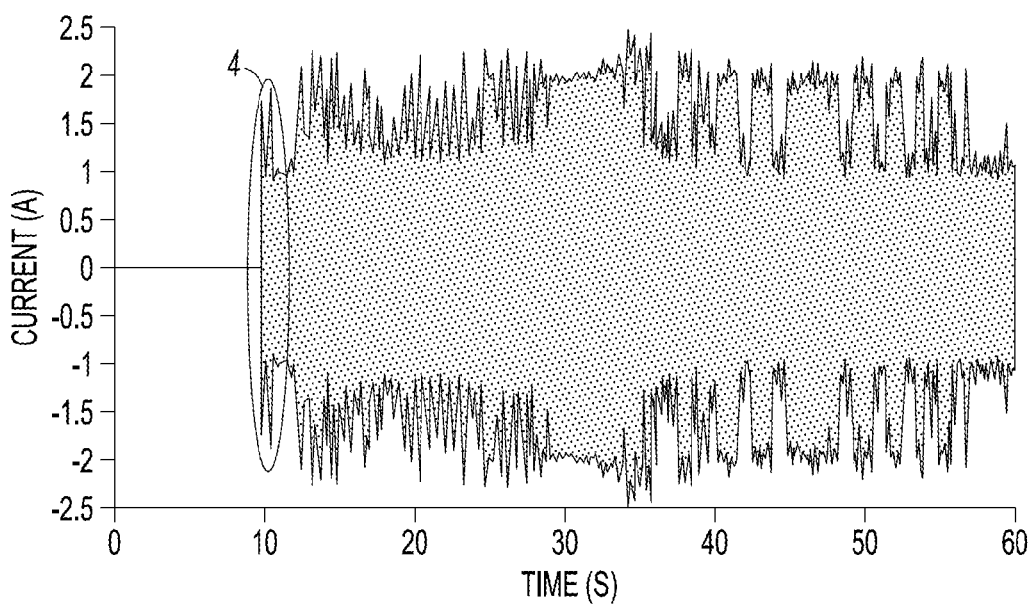
FIGS. 2-4 are current versus time plots including spikes, a step-rising-state (stepR-state), and an intermittent-state, respectively, in accordance with embodiments of the disclosed concept.
Figure 3:
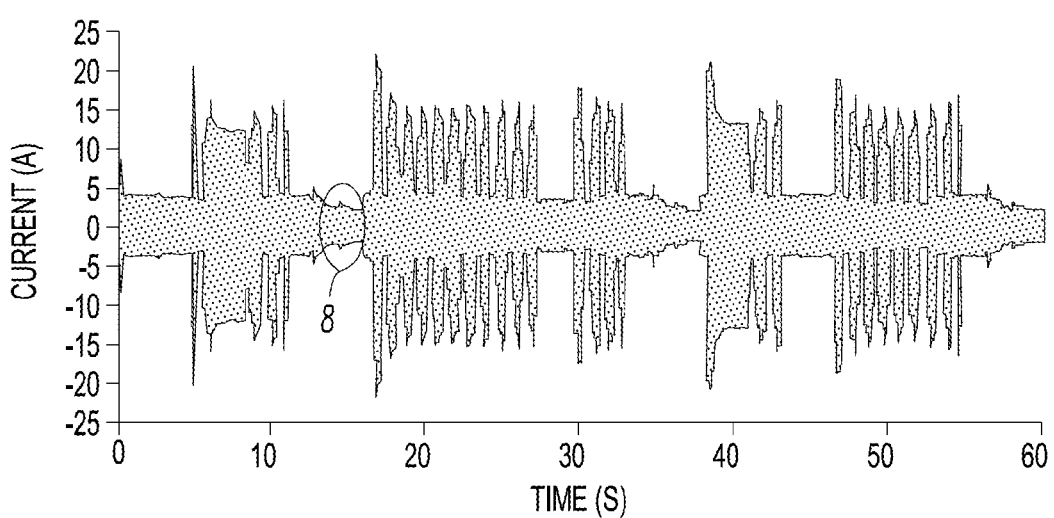
Figure 4:
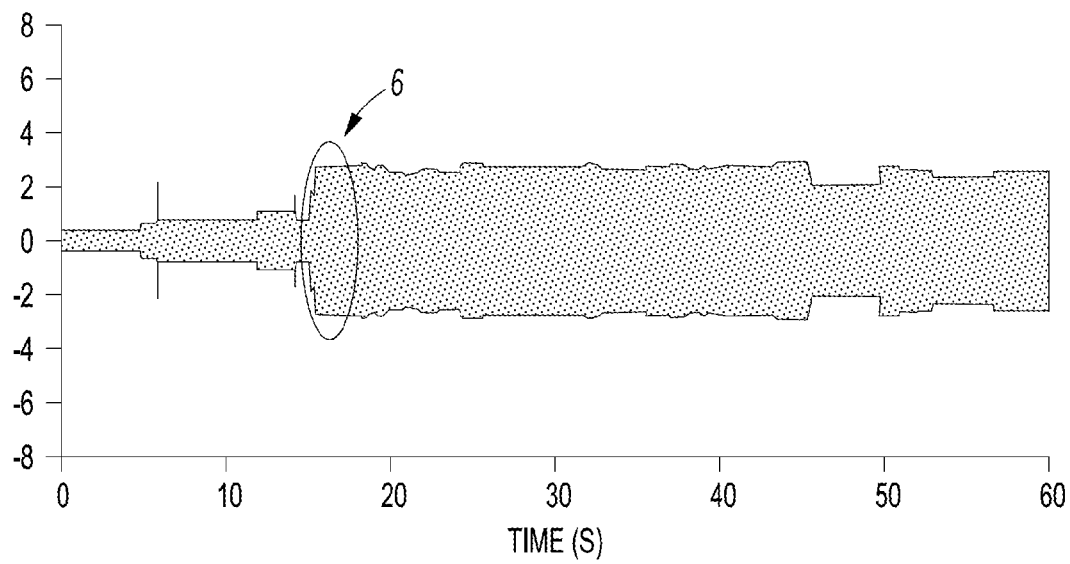

FIGS. 2-4 show examples of spikes 4, the stepR-state 6, and the intermittent-state 8.

Figure 5:
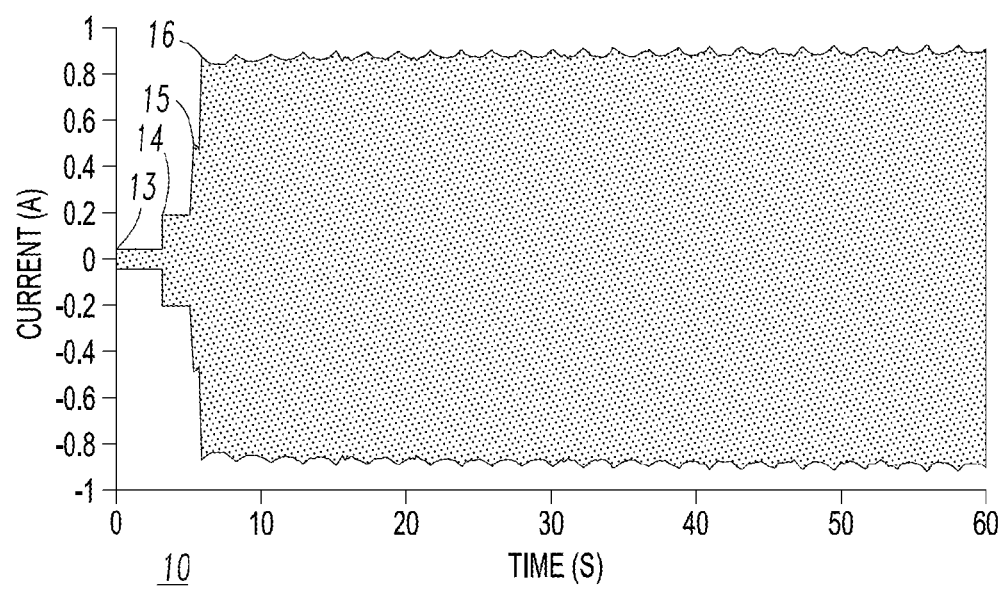
FIG. 5 is a current versus time plot employed with a finite state machine (FSM) model in accordance with embodiments of the disclosed concept.
Figure 6:
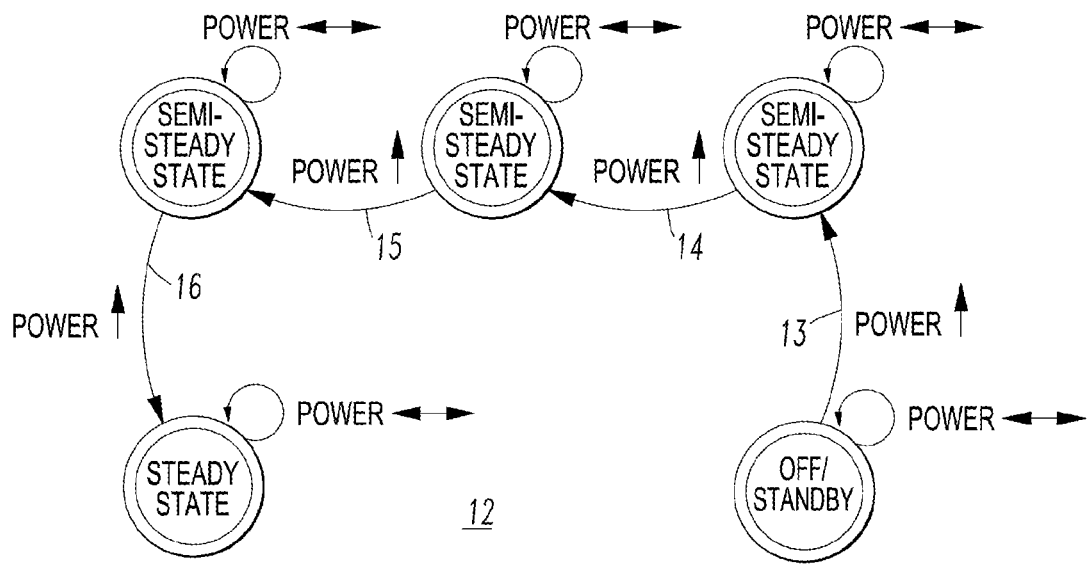
FIG. 6 is a diagram showing the FSM model applied to the current versus time plot of FIG. 5.

FIG. 5 shows an example current versus time plot 10 and FIG. 6 shows an example of a corresponding FSM model 12 that describes an LCD television start-up operation for 60 seconds. The events "Power↑", "Powel↓," (not shown), and "Power↔" denote the increase, the decrease, and no change, respectively, in the instantaneous power/current. In particular, four "Power↑" events 13,14,15,16 are shown in FIGS. 5 and 6.

A major advantage of modeling long-term (or start-up and transient) observations by FSMs lies in the capability of FSMs to extract repetitive patterns and reduce duplicate states and transitions by allowing self-state transitions. For example, when a laser printer is carrying out a multi-page printing job, a similar pattern in the current signal is repeated. Each repetitive pattern is generated by the printing of one page. Each repetitive pattern may not be exactly the same and the time durations between the repetitive patterns are also not exactly identical in practice, which introduce extra difficulties to extract and model them. However, the FSM can extract the common pattern by state transitions and eliminate the effect of time by self-state transitions.

Figure 7:
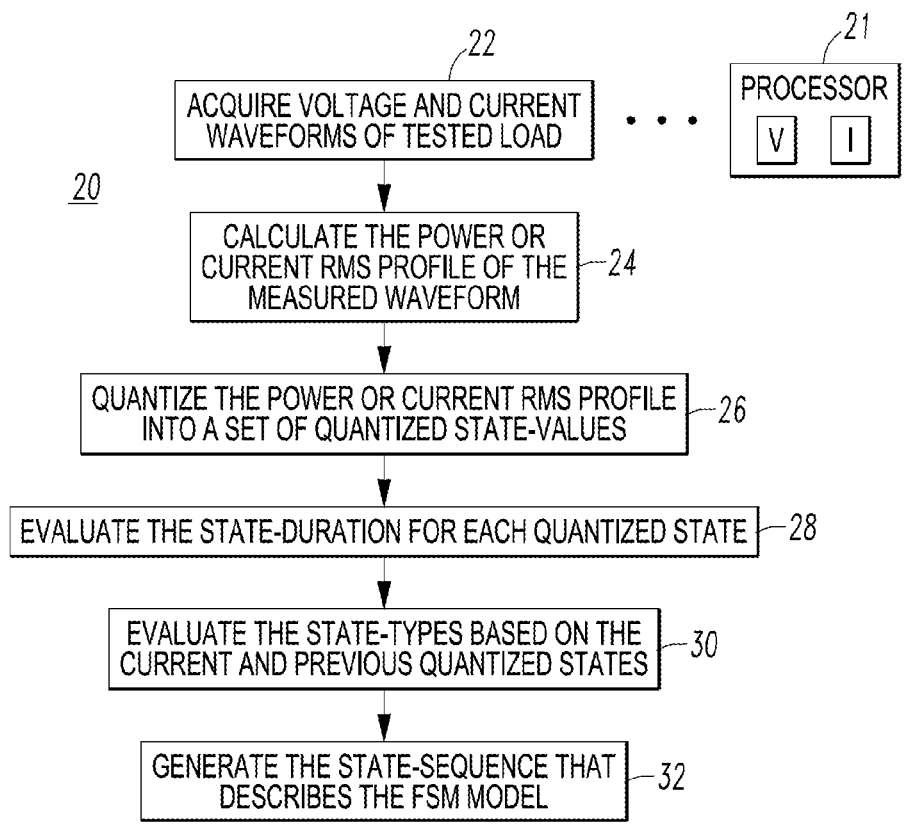
FIG. 7 is a flowchart of a procedure for FSM modeling in accordance with embodiments of the disclosed concept.
Figure 8:
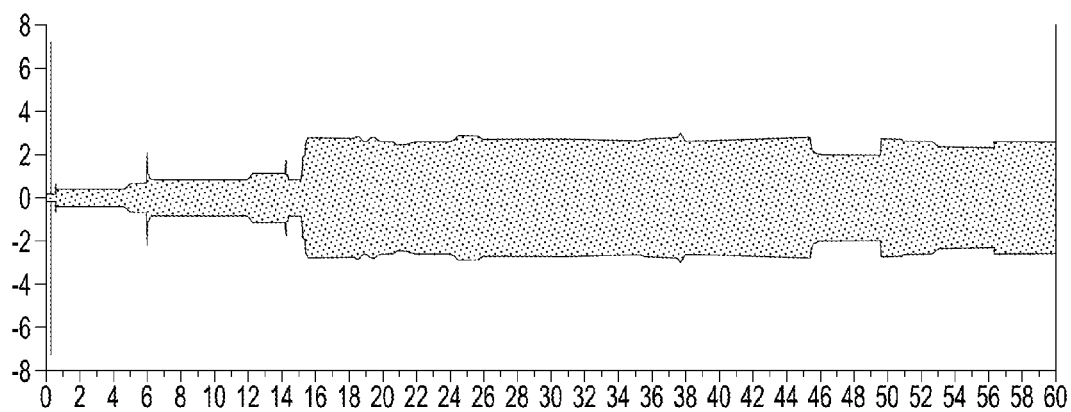
FIG. 8 is a plot of an extracted power/current profile for the FSM modeling procedure of FIG. 7.

FIG. 7 show an FSM modeling procedure 20 executed by a processor 21 for load start-up/operating behavior modeling of plug-in loads. The procedure 20 includes acquire, at 22, voltage and current waveforms of a tested load from voltage (V) and current (I) sensors of the processor 21; calculate, at 24, the power or current RMS profile of the measured waveform; quantize, at 26, the power or current RMS profile into a set of quantized state-values; evaluate, at 28, the state-duration for each quantized state; evaluate, at 30, the state-types based on the current and previous quantized states; and generate, at 32, the state-sequence that describes the FSM model.

Figure 9:
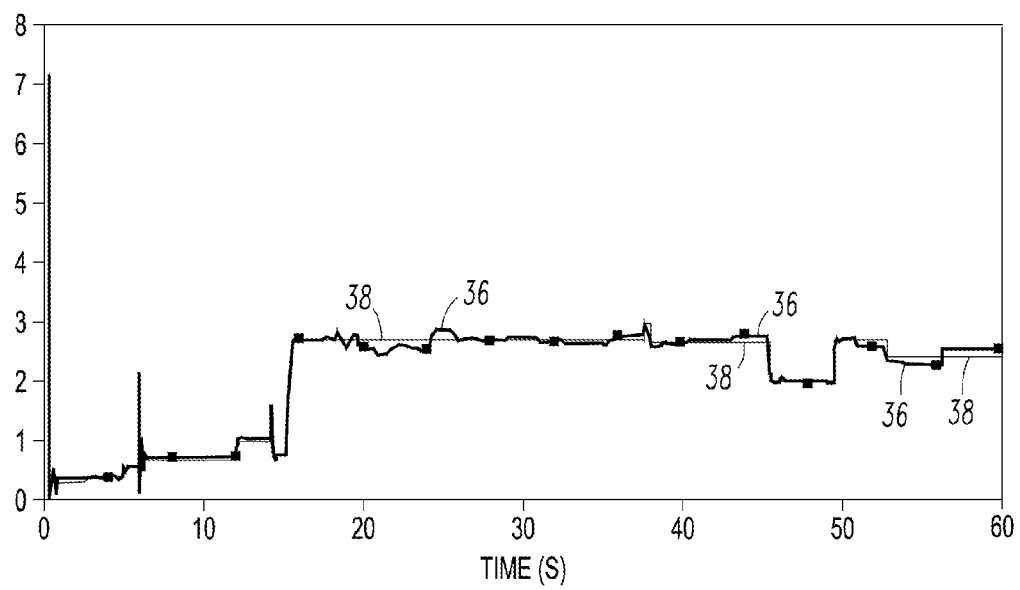
FIG. 9 is a quantization of the power/current profile extracted in FIG. 8.
Figure 10:
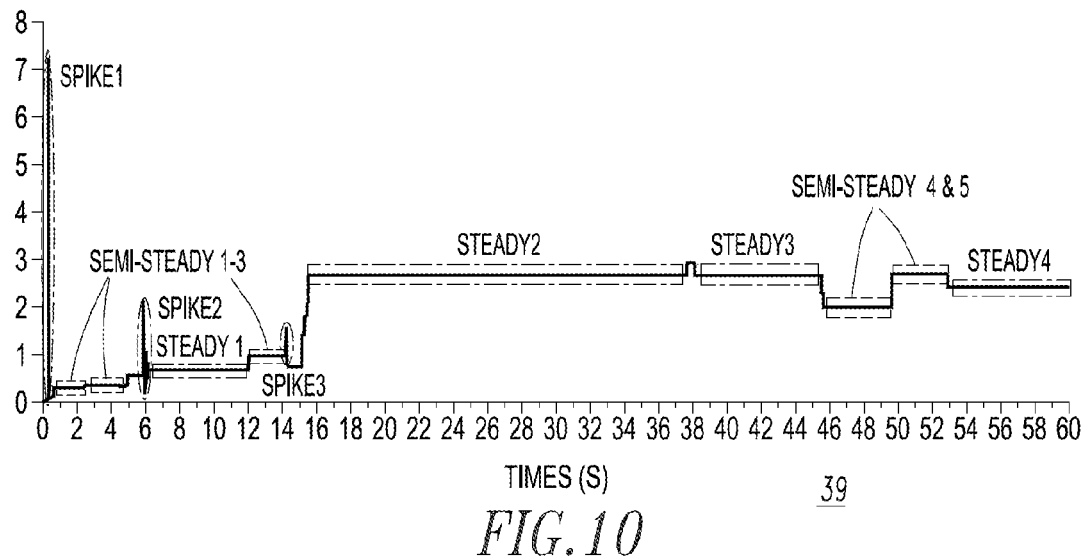
FIG. 10 is a state-sequence generated from the quantized power/current profile of FIG. 9.
Figure 11:
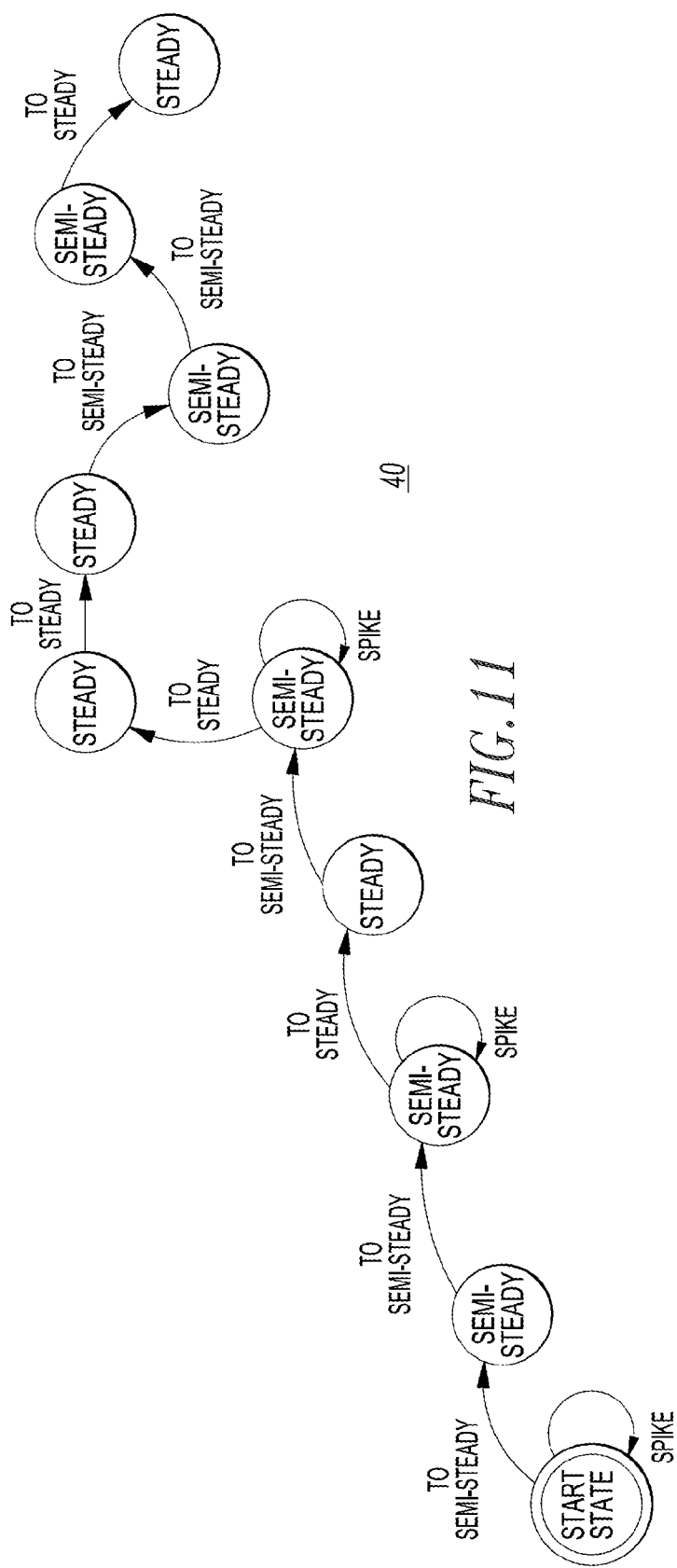
FIG. 11 is a FSM representation for the generated state-sequence of FIG. 10.
Figure 13A:
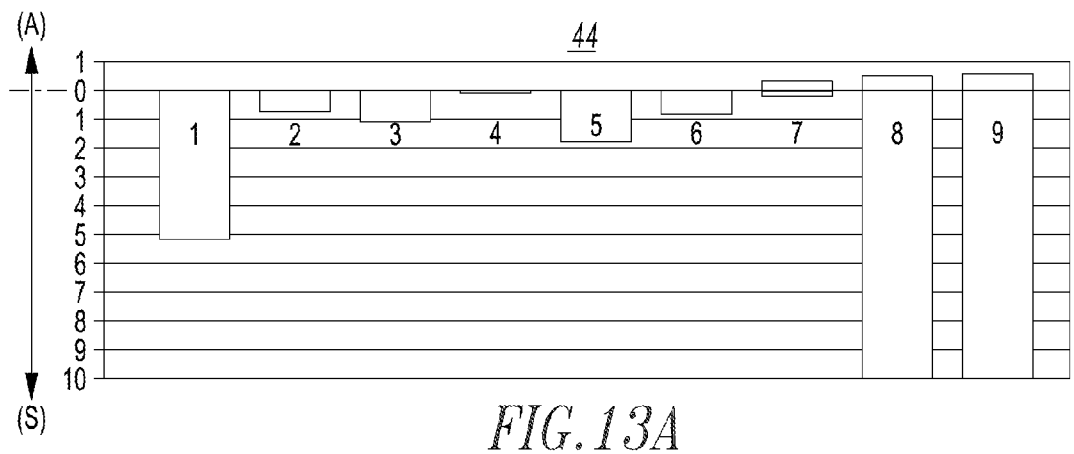
FIGS. 13A and 13B, 14A and 14B, 15A, 15B, 15C, and 15D are time-charts of generated state-sequences for monitors/televisions, personal computers, a fan, a space-heater, a microwave, and a shredder, respectively, in accordance with embodiments of the disclosed concept.
Figure 13B:
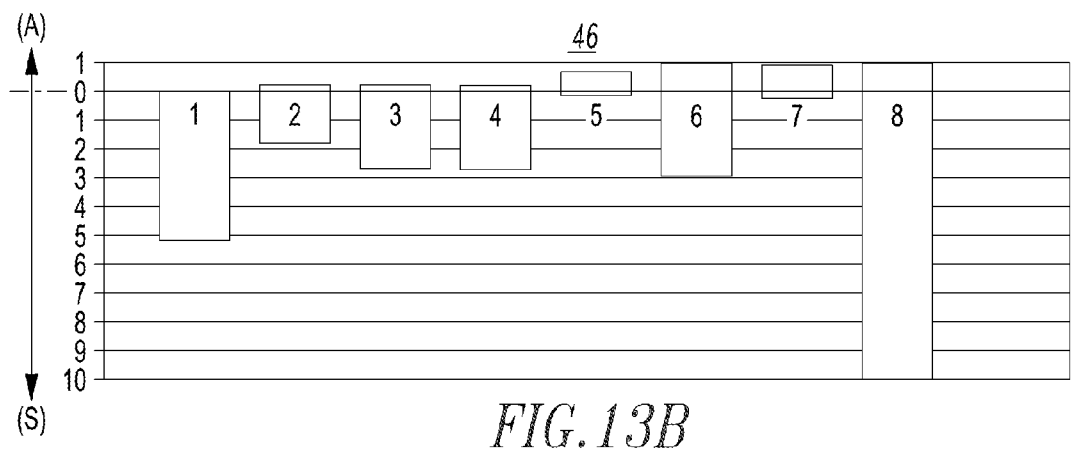
Figure 14A:
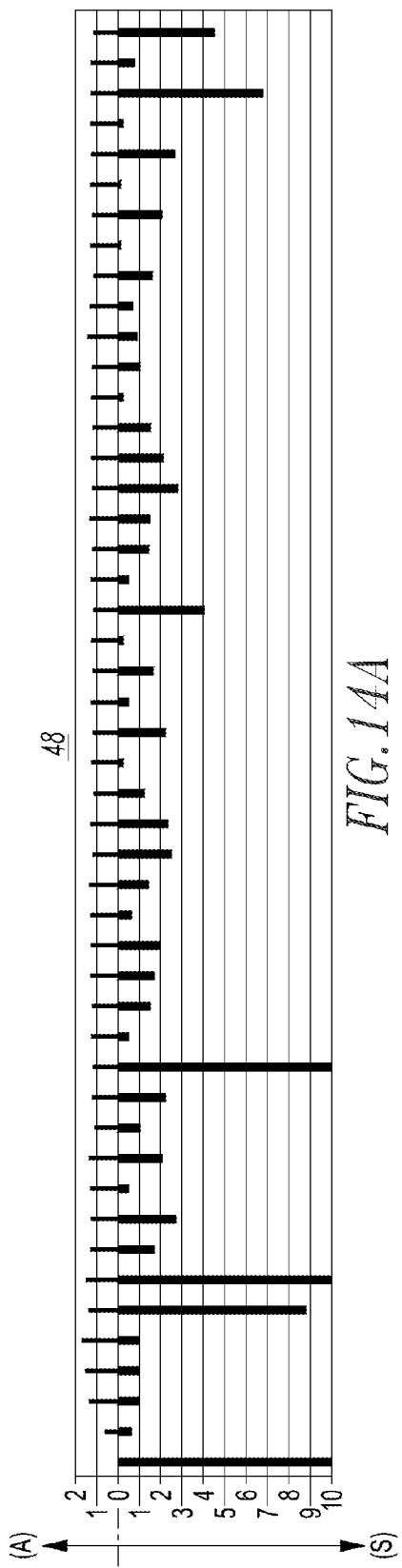
Figure 14B:
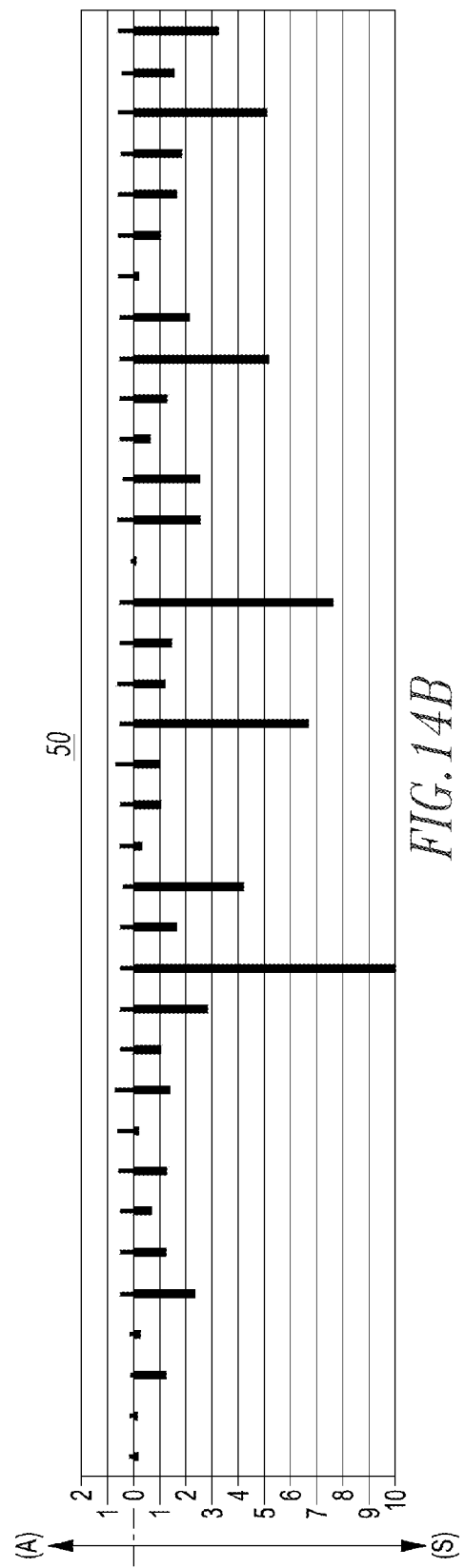
Figure 15A:
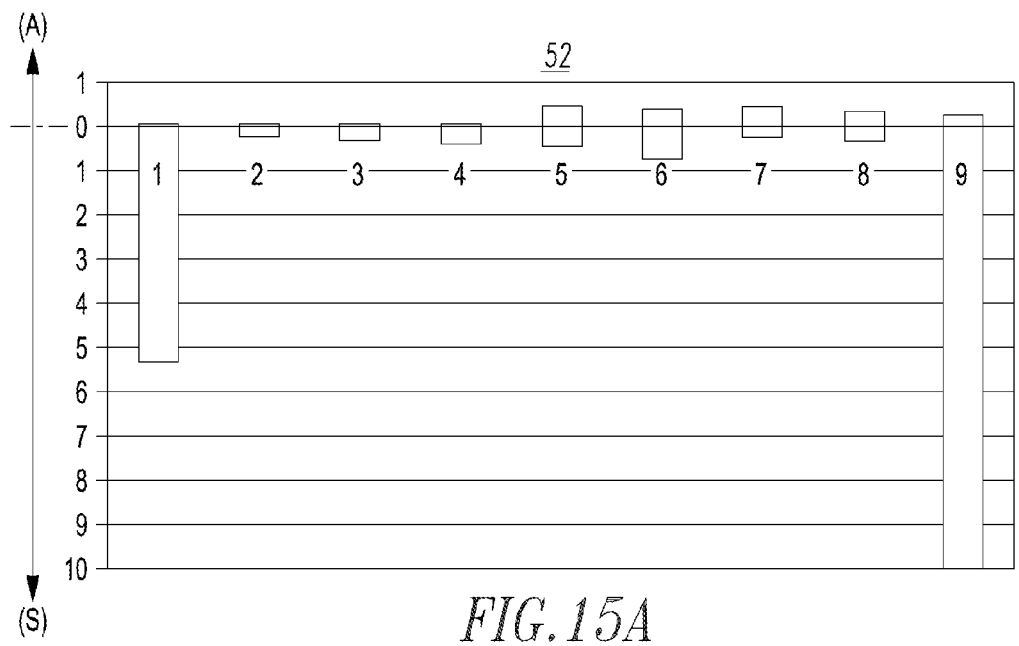
Figure 15B:
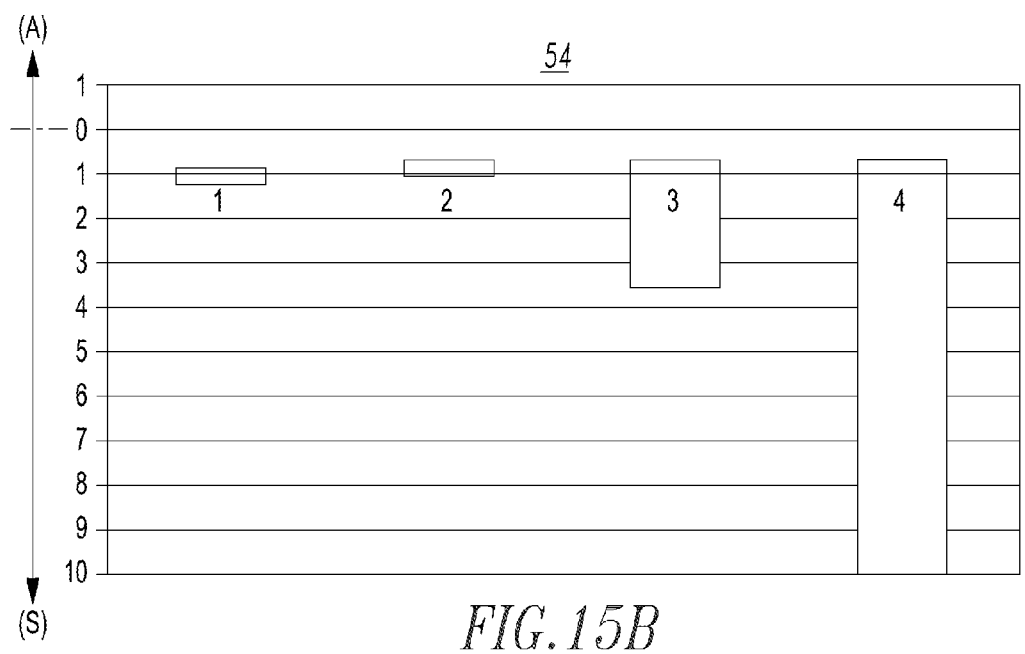
Figure 15C:
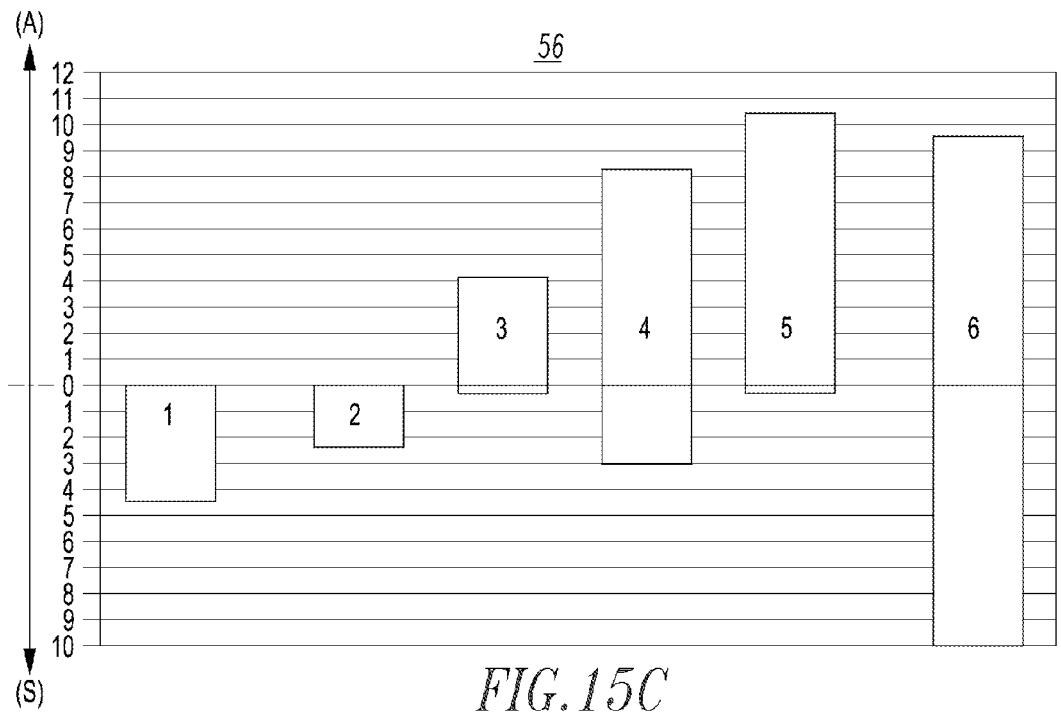
Figure 15D:
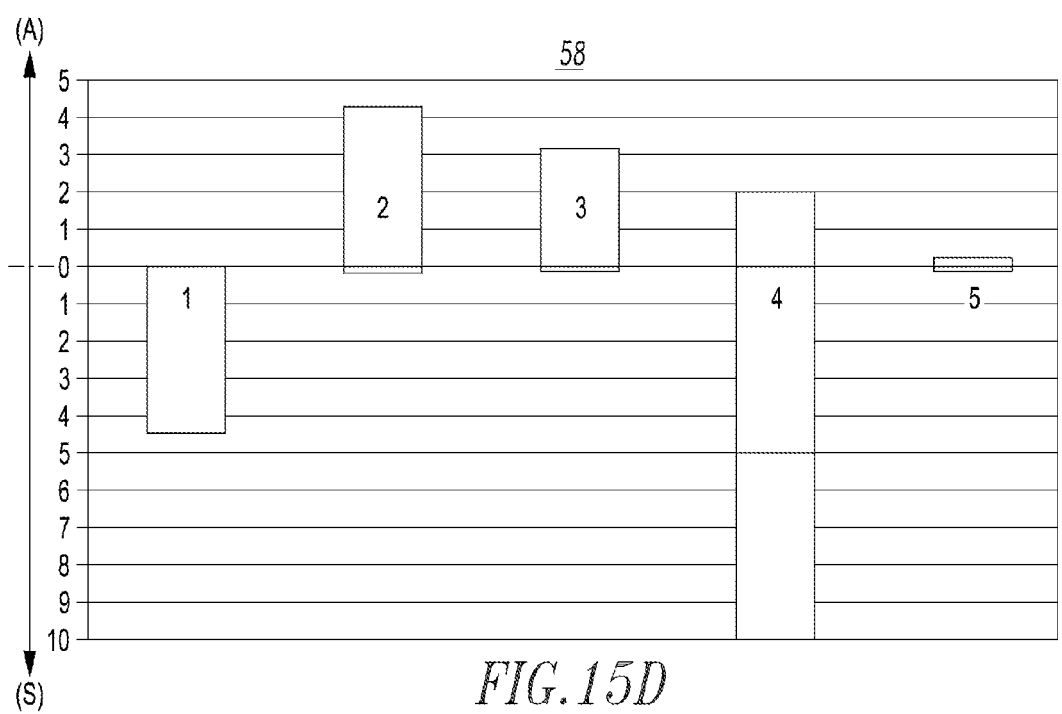

FIGS. 8-11 show a non-limiting example of the FSM modeling procedure 20 of FIG. 7 for a plasma television, including the quantized current waveform and the resultant states. In the first step, shown in FIG. 8, the power/current profile 34 is acquired and calculated (steps 22 and 24 of FIG. 7) for the plasma television's start-up operation over 60 seconds (or any suitable predetermined time). FIG. 9 shows the second step, power/current profile quantization (step 26 of FIG. 7) including the actual current 36 and the quantized current 38 versus time. In the third step, shown in FIG. 10, generation of a state-sequence 39 occurs (steps 28, 30 and 32 of FIG. 7). The final step is the FSM representation 40 as shown in FIG. 11.

To summarize, the resultant information is a state-sequence that contains three fields of information: (1) state-type; (2) state-value; and (3) state-duration. Table 1 shows the details of the example FSM representation 40 of FIG. 11.

TABLE 1

| State-Type | State-Value (A) | State-Duration (S) |
|---|---|---|
| Standby | 0.021 | 0.2 |
| Spike | 7.20 | 0 |
| Spike | 7.10 | 0 |
| Spike | 7.20 | 0 |
| Semi | 0.38 | 1.5 |
| Semi | 0.48 | 1.7 |
| Spike | 2.10 | 0 |
| Steady | 0.75 | 5.6 |
| Semi | 1.00 | 1.9 |
| Spike | 1.60 | 0 |
| Semi | 0.83 | 0.8 |
| Steady | 2.74 | 22.1 |
| Steady | 2.74 | 7.1 |
| Semi | 2.00 | 3.5 |
| Semi | 2.75 | 3.2 |
| Steady | 2.51 | 7.0 |

A meaningful feature extraction from the resultant state-sequence establishes distinctions between various different FSM models of various different plug-in loads. The following are several non-limiting example candidate features: (1) number of spikes; (2) number of semi-steady states; (3) number of steady states; (4) ratio of total time in semi-steady states versus total observation time; (5) ratio of total time in steady states versus total observation time; (6) number of quantized states per second; and (7) number of repeated sequence of states.

Figure 12:
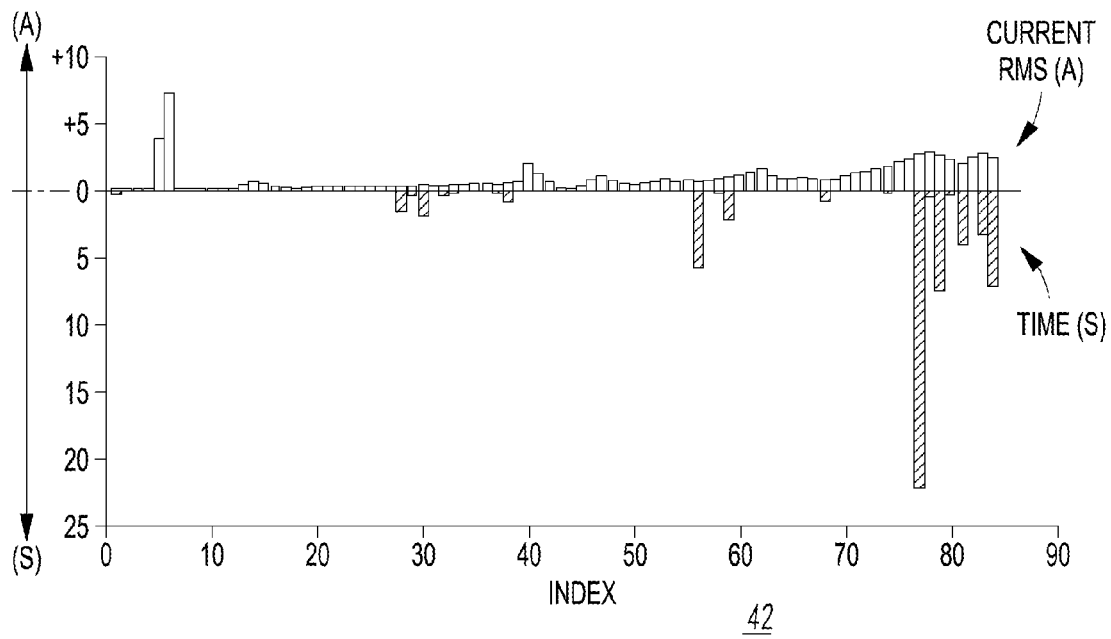
FIG. 12 is a time-chart of the generated state-sequence of FIG. 11.

The resultant state-sequence can also be represented by a time-chart 42 of the example state-sequence as shown in FIG. 12. The X-axis is the index of the quantized states. The Y-axis for the positive half plane is the state-value (current RMS (A)), and the Y-Axis for the negative half plane is the state-duration (seconds (S)). Each data point represents one state.

FIGS. 13A and 13B and 14A and 14B show examples of time-charts 44,46 for monitors/televisions and time-charts 48,50 for PCs, respectively.

FIGS. 15A-15D show examples of time-charts 52,54,56, 58 for a fan, a space-heater, a microwave, and a shredder, respectively.

These time-charts provide a visualized similarity between loads of the same type, but at the same time, show a significant distinction between loads of different types.

The seventh feature above (i.e., number of repeated sub-sequences of states), employs detection of the existence of repetitive patterns, and the number of repetitions of such sub-sequences. As a definition, one sub-sequence of states refers to a subset of sequential states. To identify the repetitive patterns, it is important to understand how similar the sub-sequences are. The following characteristics are considered: (1) state-value for steady-states and/or semi-steady-states; (2) state-duration for steady-states and/or semi-steady-states; and (3) the state-types.

Figure 16:
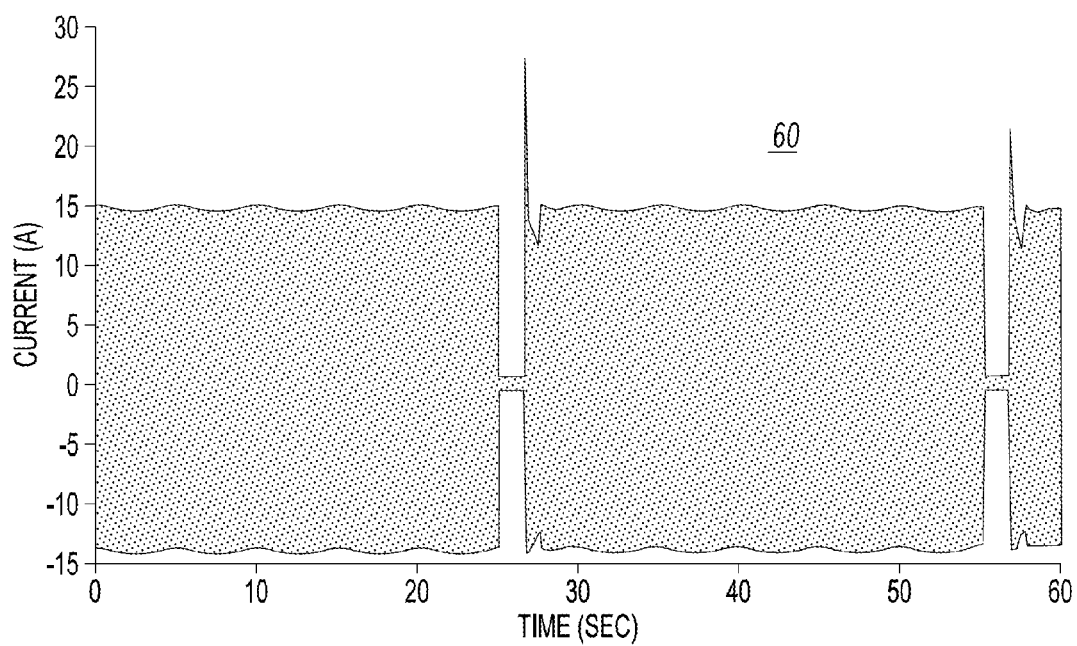
FIG. 16 is a current versus time plot of a microwave in reheat mode for 60 seconds.

For instance, for a particular type of microwave oven in an operating mode, such as an example reheat mode, FIG. 16 shows the current versus time waveform 60 of the microwave in the reheat mode for 60 seconds.

The above similarity and distinction can be quantified by the other features (1) through (6) as discussed above, which can be derived through the time-charts (e.g., FIGS. 12, 13A, 13B, 14A, 14B, 14C and 14D). The feature values of the example plug-in loads are presented below. The resultant state-sequence is given in Table 2.

TABLE 2

| State-Type | State-Value (A) | State-Duration (S) |
|---|---|---|
| Steady | 15.36 | 25.1 |
| Semi-Steady | 0.47 | 1.5 |
| Steady | 15.37 | 27.6 |
| Semi-Steady | 0.47 | 1.6 |
| Semi-Steady | 14.6 | 2.1 |

Ideally, the goal to recognize a repetitive pattern for a state-sequence under observation should consist of at least three sub-sequences, each of which shares the similar state-value, state-duration with the same state-type. In the above example, a repetitive pattern steady→semi-steady is observed to appear twice in the first four rows of Table 2.

Figure 17:
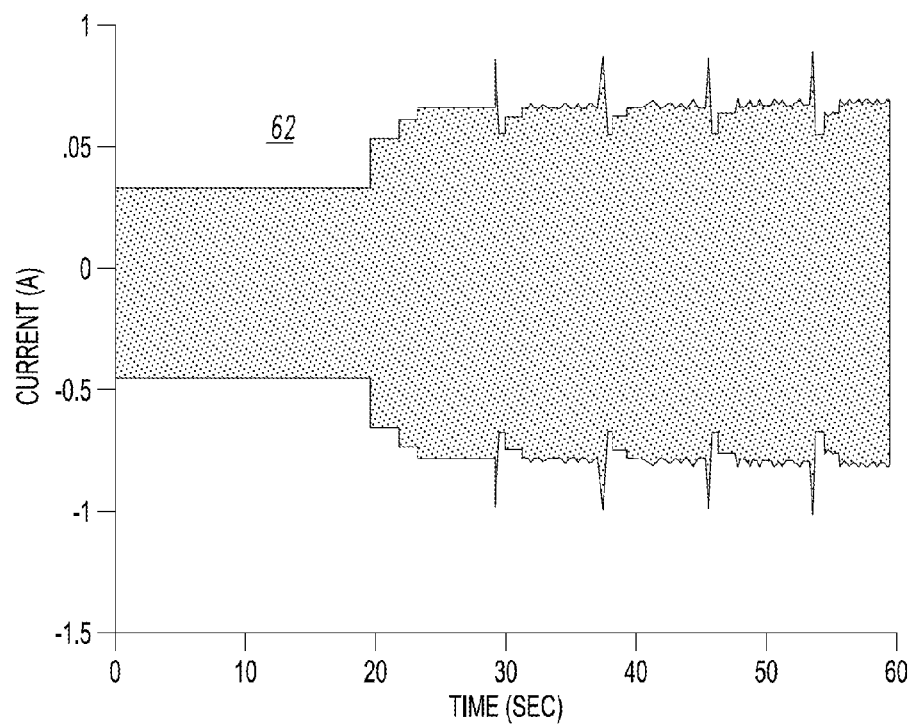
FIG. 17 is a current versus time plot including identical repetitive patterns in accordance with an embodiment of the disclosed concept.

Three non-limiting examples of repetitive patterns for plug-in loads will now be discussed. First, there can be (nearly) identical repetitive patterns. In this scenario, one state (e.g., a steady-state or a semi-steady state) appears repetitively in the state-sequence, with possibly one or several intermittent states in between. The state-value and the state-duration remain approximately constant (e.g., variances in magnitudes for each of these three values are limited by, for instance, −5% or any other suitable predetermined value) during the entire time period under observation. A non-limiting example of such a repetitive pattern is shown in the current versus time waveform 62 of FIG. 17. The resultant state-sequence is shown in Table 3 (inter-states are not included) in which rows 3-6 represent the recognized repetitive pattern.

TABLE 3

| State Type | State Value (A) | State Duration (S) |
|---|---|---|
| Steady | 0.33 | 19.7 |
| Semi | 0.53 | 2.1 |
| Steady | 0.66 | 5.8 |
| Steady | 0.67 | 5.8 |
| Steady | 0.67 | 5.8 |
| Steady | 0.68 | 5.8 |
| Semi | 0.67 | 3.7 |

Figure 18:
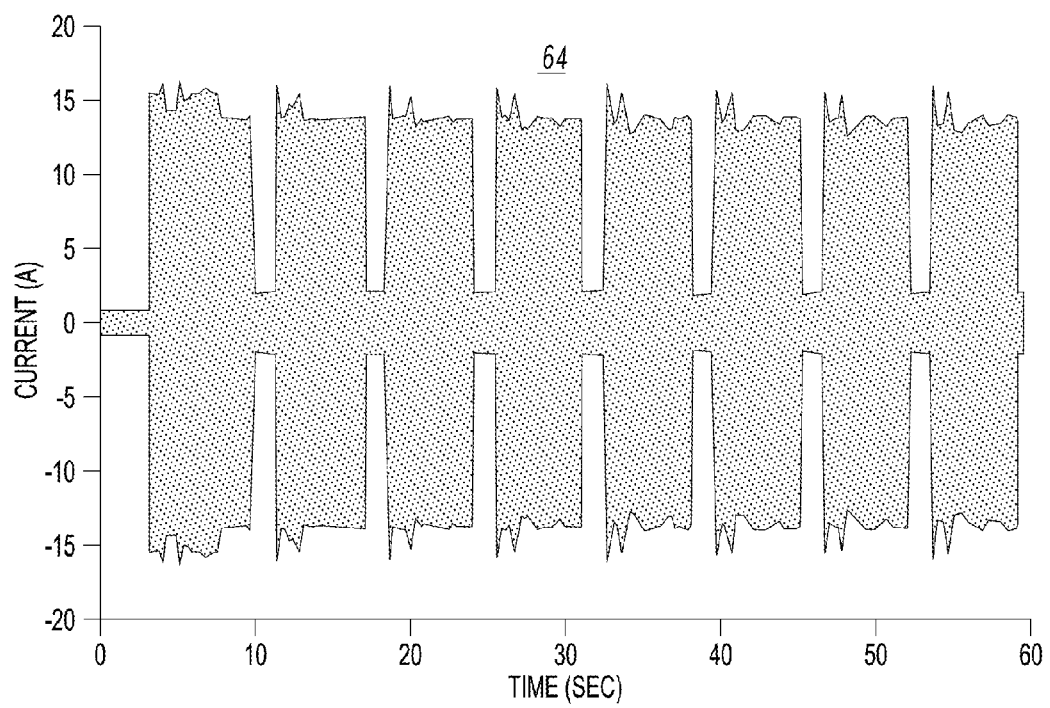
FIG. 18 is a current versus time plot including repetitive step up/down patterns in accordance with an embodiment of the disclosed concept.

Secondly, there can be step up/down repetitive patterns. In this scenario, sub-sequences of semi-steady and/or steady states with step up/down state values and state durations appear repetitively in the state-sequence. The state values and state durations of the corresponding semi-steady and/or steady states remain numerically close. Similar to the case of (nearly) identical repetitive patterns, intermittent-states and spike events may occur. The example current versus time waveform 60 of FIG. 16 falls into this category. FIG. 18 shows another example of such a pattern in the current versus time waveform 64. A printing job is repeated 8 times in this example. The resultant state-sequence is shown in Table 4.

TABLE 4

| | | | After combining similar states | | Step Down Ratio | | |
|---|---|---|---|---|---|---|---|
| State Type | State-Value (A) | State-Duration (S) | State-Value (A) | State-Duration (S) | State-Value | State-Duration | Sub-sequence |
| semi | 14.70 | 4.93 | 14.70 | 4.93 | 7.5 | 4 | Sub-sequence-1 |
| semi | 1.96 | 1.23 | 1.96 | 1.23 | | | |
| semi | 13.96 | 1.1 | 13.96 | 5.13 | 6.55 | 4.2 | Sub-sequence-2 |
| semi | 13.71 | 4.03 | | | | | |
| semi | 2.13 | 1.22 | 2.13 | 1.22 | | | |
| semi | 14.09 | 1.42 | 14.09 | 5.17 | 7.05 | 3.52 | Sub-sequence-3 |
| semi | 12.58 | 3.75 | | | | | |
| semi | 2.00 | 1.47 | 2.00 | 1.47 | | | |
| semi | 13.72 | 4.22 | 13.72 | 4.22 | 6.32 | 3.52 | Sub-sequence-4 |
| semi | 2.17 | 1.20 | 2.17 | 1.20 | | | |
| semi | 13.72 | 3.25 | 13.72 | 3.25 | 7.30 | 2.78 | Sub-sequence-5 |
| semi | 1.88 | 1.17 | 1.88 | 1.17 | | | |
| semi | 13.54 | 3.2 | 13.54 | 3.2 | 6.77 | 2.67 | Sub-sequence-6 |
| semi | 2.00 | 1.2 | 2.00 | 1.2 | | | |
| semi | 13.57 | 3.27 | 13.57 | 3.27 | 6.85 | 2.66 | Sub-sequence-7 |
| semi | 1.98 | 1.23 | 1.98 | 1.23 | | | |
| semi | 13.42 | 3.2 | 13.42 | 3.2 | | | |

After combining adjacent semi-steady states with almost identical state values (i.e., semi-steady states with state values 13.96 A and 13.71 A), the repetitive sub-sequences of states indicated in Table 4 represent the recognizable repetitive patterns. In this example, seven sub-sequences with a step-down pattern in both state values and state durations can be observed and detected. The first several step-down sub-sequences have relatively higher pre-step state values and state durations, i.e., 14.70 A, 13.96 A, and 14.09 A, as the printer just transits from standby mode to active mode. The latter three sub-sequences have relatively smaller but almost identical pre-step state values, 13.72 A/3.25 S, 13.54 A/3.2 S, and 13.57 A/3.27 S, as the printer is in a stable active mode. The post-step state values remain close to 2 A and the post-step state durations remain close to 1.2 S.

Figure 19:
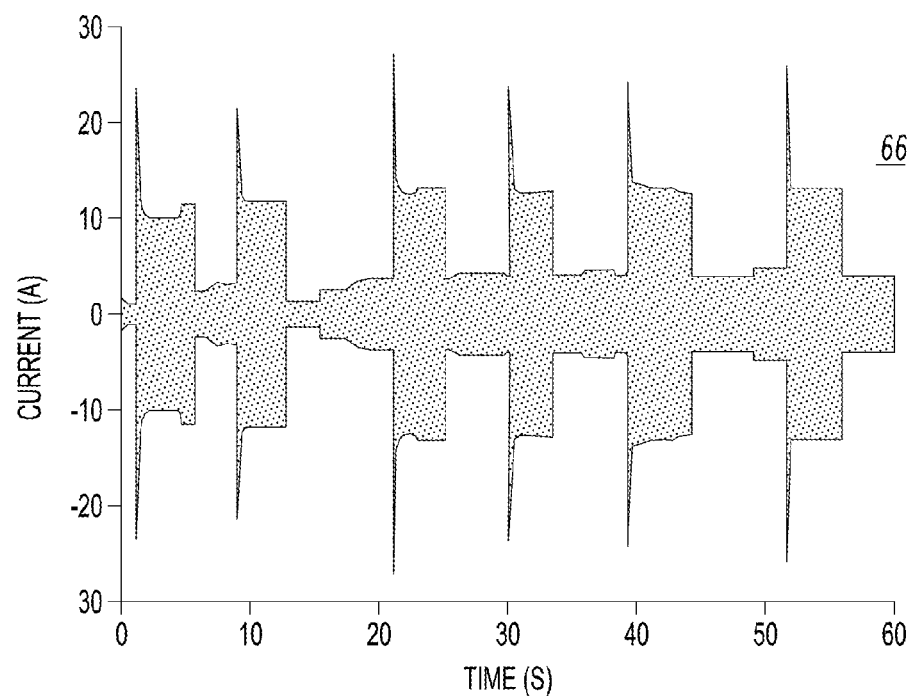
FIG. 19 is a current versus time plot including spike-lead repetitive patterns in accordance with an embodiment of the disclosed concept.

Third, there can be spike-lead recurrent patterns. In this scenario, repetitive sub-sequences of states led by one or two spikes are observed in a state-sequence. It is noticed that, in this scenario, neither the state-duration nor the cycle time of the repetitive pattern is constant through the observed state-sequence. The state-value also varies with time. An example of such a pattern is shown in the current versus time waveform 66 of FIG. 19. There are 6 printing-operations happening during the time duration under observation. The resultant state-sequence is shown in Table 5.

TABLE 5

| State-Type | State-Value (A) | State-Duration (S) | Repetitive Sub-sequences |
|---|---|---|---|
| spike | 23.21 | 0 | Subsequence-1 |
| semi | 11.08 | 2.87 | |
| semi | 11.02 | 1.07 | |
| semi | 2.98 | 2.18 | |
| spike | 20.32 | 0 | Subsequence-2 |
| semi | 12.75 | 3.32 | |
| semi | 1.18 | 2.38 | |
| semi | 2.69 | 1.88 | |
| semi | 3.36 | 1.75 | |
| semi | 3.76 | 1.48 | |
| spike | 23.22 | 0 | Subsequence-3 |
| semi | 12.96 | 3.55 | |
| semi | 4.24 | 4.25 | |
| spike | 20.80 | 0 | Subsequence-4 |
| semi | 13.04 | 2.38 | |
| semi | 4.08 | 2.45 | |
| semi | 4.50 | 2.53 | |

TABLE 5-continued

| State-Type | State-Value (A) | State-Duration (S) | Repetitive Sub-sequences |
|---|---|---|---|
| spike | 21.97 | 0 | Subsequence-5 |
| semi | 13.85 | 4.5 | |
| semi | 4.10 | 4.5 | |
| semi | 4.60 | 2.43 | |
| spike | 22.97 | 0 | Subsequence-6 |
| semi | 14.17 | 4.45 | |
| semi | 4.15 | 3.63 | |

The repetitive sub-sequences of states are indicated in Table 5 to represent the recognized repetitive pattern.

For the second and particularly the third scenarios, above, relatively longer term statistics evaluation (e.g., without limitation, means and variances of step-up/down ratios, and/or cycle time) is employed to reliably detect the repetitive pattern, when the repeated behavior is not as consistent as in the first scenario.

Various FSM models of several typical plug-in loads can be considered as examples. The resultant FSM features are presented in the following sequence: (1) number of spikes; (2) number of semi-steady states; (3) number of steady states; (4) ratio of total time in semi-steady states versus total observation time; (5) ratio of total time in steady states versus total observation time; and (6) number of quantized states per second.

Figure 20:
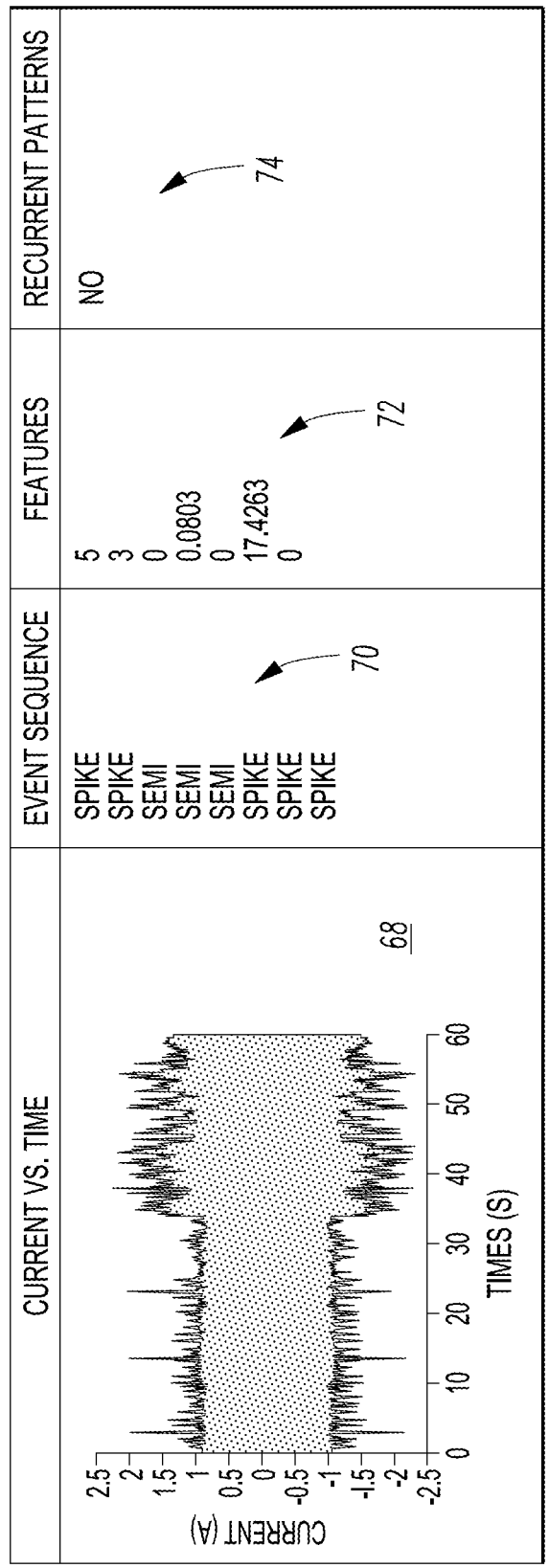
FIG. 20 is a current versus time profile accompanied by a corresponding event sequence, features and recurrent features for a particular laptop being charged in accordance with an embodiment of the disclosed concept.

FIG. 20 shows a current versus time profile 68, the corresponding event sequence 70, the corresponding features 72 and any recurrent patterns 74 for a particular laptop being charged.

Figure 21:
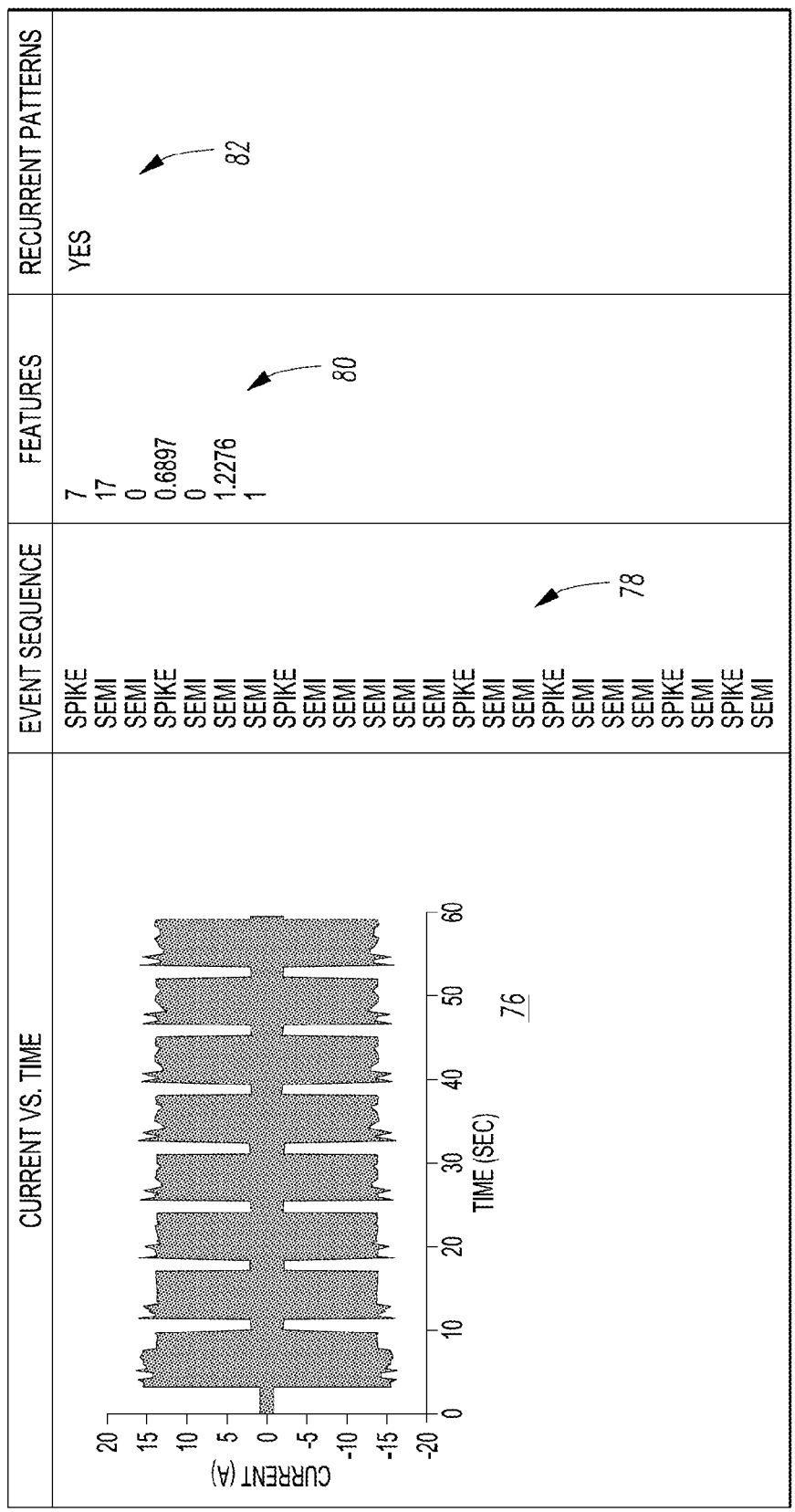
FIG. 21 is a current versus time profile accompanied by a corresponding event sequence, features and recurrent features for a particular printer performing double-sided printing in accordance with an embodiment of the disclosed concept.

FIG. 21 shows a current versus time profile 76, the corresponding event sequence 78, the corresponding features 80 and any recurrent patterns 82 for a particular printer performing double-sided printing.

Figure 22:
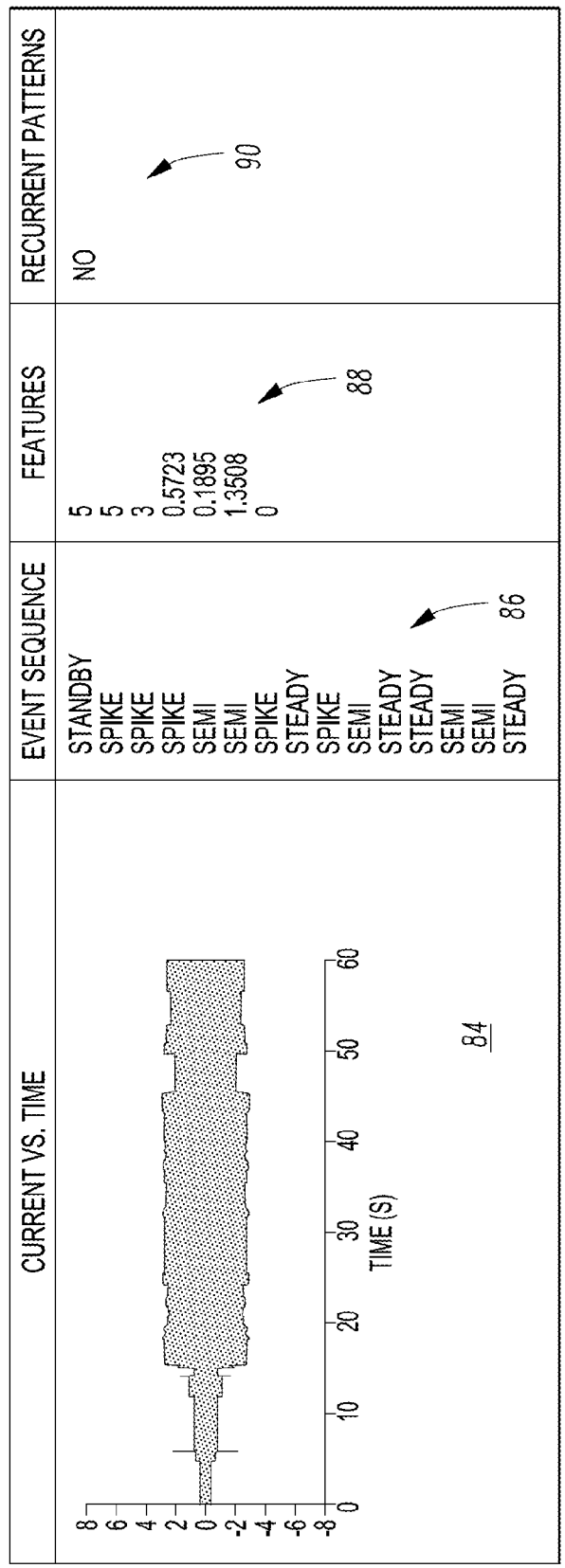
FIG. 22 is a current versus time profile accompanied by a corresponding event sequence, features and recurrent features for a particular LCD television during start-up in accordance with an embodiment of the disclosed concept.

FIG. 22 shows a current versus time profile 84, the corresponding event sequence 86, the corresponding features 88 and any recurrent patterns 90 for a particular LCD television during start-up.

Table 6 summarizes a non-limiting example of various FSM features employed to distinguish and classify various plug-in loads.

TABLE 6

| | Number of Spikes | Number of Semi-States | Number of Steady-States | Semi/Total | Steady/Total | Discretized Value/Second | Repeated Patterns |
|---|---|---|---|---|---|---|---|
| Computers | 0-11 | <25, nonzero | <5, typically 0 | <0.6 | <0.4, typically 0 | >5 | None |
| Office appliances | Typically >10 | Typically around 10 | 0 | Typically <0.7 | 0 | Typically 6-10 | Typically 2-7 |
| | <10 | 1-16 | 1-10 | <0.4 | 0.15-0.8 | Typically <1.5 | |
| Microwave | <5 | 1-5 | 1-5 | <0.2 | >0.8 | <1 | 2-5 |
| Monitors and Televisions | <5 | 5-10 for startup | 0-2 for startup | <0.2 | >0.8 | ~1 | None |
| | | | Steady: only one state | | | | |

The disclosed concept can be employed in combination with the teachings of any or all of: (1) U.S. Patent Application Pub. No. 2013/0138651, entitled: "System And Method Employing A Self-Organizing Map Load Feature Database To Identify Electric Load Types Of Different Electric Loads"; (2) U.S. Patent Application Pub. No. 2013/0138661, entitled: "System And Method Employing A Minimum Distance And A Load Feature Database To Identify Electric Load Types Of Different Electric Loads"; and (3) U.S. patent application Ser. No. 13/597,324, filed Aug. 29, 2012, entitled: "System And Method For Electric Load Identification And Classification Employing Support Vector Machine", all of which are incorporated by reference herein.

The resultant FSM features extracted from the disclosed FSM model can be used as the inputs to the classification and identification systems that have been disclosed in the above three patent applications to derive the type/category of the load under observation. With reference to the hierarchical load identification architecture as disclosed in Pub. No. 2013/0138669, the disclosed concept can be applied to provide the features that are needed by the Level-2 load sub-category identification, in order to identify the corresponding one of the different electric load types.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A system for a plurality of different electric load types, the system comprising:
    a plurality of sensors structured to sense a voltage signal and a current signal for each of the different electric loads; and
    a processor structured to:
        acquire a voltage and current waveform from the sensors for a corresponding one of the different electric load types;
        calculate a power or current RMS profile of the waveform;
        quantize the power or current RMS profile into a set of quantized state-values;
        evaluate a state-duration for each of the quantized state-values;
        evaluate a plurality of state-types based on the power or current RMS profile and the quantized state-values;
        generate a state-sequence that describes a corresponding finite state machine model of a generalized load start-up or transient profile for the corresponding one of the different electric load types; and
        identify the corresponding one of the different electric load types.

2. The system of claim 1 wherein the sensors sense the voltage signal and the current signal over a time period in the range of tens of seconds to a number of minutes.

3. The system of claim 1 wherein the processor is further structured to start the finite state machine model from an OFF or standby mode of the corresponding one of the different electric load types, compare the power or current RMS profile of a current cycle with a power or current RMS profile of a number of previous cycles, consider two adjacent cycles to be in the same state if a change in the power or current RMS profile between two adjacent cycles is less than a predetermined percentage; and consider that the power or current RMS profile of the current cycle is in a new state if the change in the power or current RMS profile between the two adjacent cycles is greater than the predetermined percentage.

4. The system of claim 3 wherein the processor is further structured to employ a state-value as an instantaneous value of the current RMS profile of the current cycle in the new state; and employ the state-duration as a count of cycles that the current RMS profile stays in the new state.

5. A system for a plurality of different electric load types, the system comprising:
    a plurality of sensors structured to sense a voltage signal and a current signal for each of the different electric loads; and
    a processor structured to:
        acquire a voltage and current waveform from the sensors for a corresponding one of the different electric load types;
        calculate a power or current RMS profile of the waveform;
        quantize the power or current RMS profile into a set of quantized state-values;
        evaluate a state-duration for each of the quantized state-values;
        evaluate a plurality of state-types based on the power or current RMS profile and the quantized state-values;
        generate a state-sequence that describes a corresponding finite state machine model of a generalized load start-up or transient profile for the corresponding one of the different electric load types; and
        identify the corresponding one of the different electric load types,
    wherein the processor is further structured to start the finite state machine model from an OFF or standby mode of the corresponding one of the different electric load types, compare the power or current RMS profile of a current cycle with a power or current RMS profile of a number of previous cycles, consider two adjacent cycles to be in the same state if a change in the power or current RMS profile between two adjacent cycles is less than a predetermined percentage; and consider that the power or current RMS profile of the current cycle is in a new state if the change in the power or current RMS profile between the two adjacent cycles is greater than the predetermined percentage,
    wherein the state-types are a plurality of types of states selected from the group consisting of steady-state if the new state persists for at least a first predetermined time; a semi-steady-state if the new state persists for at least a second predetermined time, which is smaller than the first predetermined time, but less than the first predetermined time; a spike if a power level of the current cycle is greater than a predetermined value times a power level of an adjacent previous cycle, remains greater than the predetermined value times the power level of the adjacent previous cycle for a number of cycles, and then returns less than the predetermined value times the power level of the adjacent previous cycle; and a step-rising-state if the power level of the current cycle is greater than the predetermined value times the power level of the adjacent previous cycle for a number of cycles before rising further within a number of cycles, and remains greater than the predetermined value times the power level of the adjacent previous cycle for more than a third predetermined time.

6. The system of claim 5 wherein the processor is further structured to define a load profile of the corresponding one of the different electric load types with a number of the steady-state and a number of the semi-steady-state.

7. The system of claim 5 wherein the processor is further structured to employ as one of the types of states an intermittent-state being an undefined state between any of the steady-state, the semi-steady-state, the spike and the step-rising-state; and employ a number of the spike, a number of the step-rising-state and a number of the intermittent-state to describe power fluctuations and short-term transitions of the corresponding one of the different electric load types.

8. The system of claim 5 wherein the processor is further structured to employ a plurality of features for the corresponding finite state machine model of the corresponding one of the different electric load types as a number of the spike, a number of the semi-steady-state, a number of the steady state, a ratio of total time in the semi-steady-state versus a total observation time of the acquiring the voltage and current waveform, a ratio of total time in the steady-state versus the total observation time, and a number of the quantized state-values per second.

9. The system of claim 8 wherein the processor is further structured to further employ as the features a number of repeated sequences of the types of states.

10. A finite state machine modeling method for a plurality of different electric load types, the method comprising:
acquiring a voltage and current waveform of a corresponding one of the different electric load types;
calculating a power or current RMS profile of the waveform;
quantizing the power or current RMS profile into a set of quantized state-values;
evaluating a state-duration for each of the quantized state-values;
evaluating a plurality of state-types based on the power or current RMS profile and the quantized state-values;
generating by a processor a state-sequence that describes a corresponding finite state machine model of a generalized load start-up or transient profile for the corresponding one of the different electric load types; and
identifying the corresponding one of the different electric load types.

11. The method of claim 10 further comprising:
starting the finite state machine model from an OFF or standby mode of the corresponding one of the different electric load types;
comparing the power or current RMS profile of a current cycle with a power or current RMS profile of a number of previous cycles;
considering two adjacent cycles to be in the same state if a change in the power or current RMS profile between two adjacent cycles is less than a predetermined percentage; and
considering that the power or current RMS profile of the current cycle is in a new state if the change in the power or current RMS profile between the two adjacent cycles is greater than the predetermined percentage.

12. The method of claim 11 further comprising:
employing a state-value as an instantaneous value of the current RMS profile of the current cycle in the new state; and
employing the state-duration as a count of cycles that the current RMS profile stays in the new state.

13. The method of claim 11 further comprising:
employing as the state-types a plurality of types of states selected from the group consisting of steady-state if the new state persists for at least a first predetermined time; a semi-steady-state if the new state persists for at least a second predetermined time, which is smaller than the first predetermined time, but less than the first predetermined time; a spike if a power level of the current cycle is greater than a predetermined value times a power level of an adjacent previous cycle, remains greater than the predetermined value times the power level of the adjacent previous cycle for a number of cycles, and then returns less than the predetermined value times the power level of the adjacent previous cycle; and a step-rising-state if the power level of the current cycle is greater than the predetermined value times the power level of the adjacent previous cycle for a number of cycles before rising further within a number of cycles, and remains greater than the predetermined value times the power level of the adjacent previous cycle for more than a third predetermined time.

14. The method of claim 13 further comprising:
defining a load profile of the corresponding one of the different electric load types with a number of the steady-state and a number of the semi-steady-state.

15. The method of claim 13 further comprising:
further employing as one of the types of states an intermittent-state being an undefined state between any of the steady-state, the semi-steady-state, the spike and the step-rising-state; and
employing a number of the spike, a number of the step-rising-state and a number of the intermittent-state to describe power fluctuations and short-term transitions of the corresponding one of the different electric load types.

16. The method of claim 15 further comprising:
employing a state-value as an instantaneous value of the current RMS profile of the current cycle in the new state;
employing the state-duration as a count of cycles that the current RMS profile stays in the new state;
employing a total observation time of the acquiring the voltage and current waveform;
including with the generated state-sequence a repetitive pattern of a plurality of states;
including as the repetitive pattern of the plurality of states over a cycle time in which one of the states is the steady-state or the semi-steady-state and appears repetitively in the generated state-sequence with the intermittent-state in between; and
employing the state-value, the state-duration, and the cycle time as being almost constant during the total observation time.

17. The method of claim 13 further comprising:
employing a plurality of features for the corresponding finite state machine model of the corresponding one of the different electric load types as a number of the spike, a number of the semi-steady-state, a number of the steady state, a ratio of total time in the semi-steady-state versus a total observation time of the acquiring the voltage and current waveform, a ratio of total time in the steady-state versus the total observation time, and a number of the quantized state-values per second.

18. The method of claim 17 further comprising:
further employing as the features a number of repeated sequences of the types of states.

19. The method of claim 10 further comprising:
including with the generated state-sequence a repetitive pattern of a plurality of states.

20. The method of claim 19 further comprising:
employing a total observation time of the acquiring the voltage and current waveform; and
employing as the repetitive pattern a step up/down repetitive pattern in which sub-sequences of states with step up/down in a state value appear repetitively in a sequence, and a ratio of pre-step and post-step state values and a cycle time between two sequential step-up transitions or two sequential step-down transitions remains constant during the total observation time.

21. The method of claim 20 further comprising:
evaluating means and variances of the step-up/down ratio and/or the cycle time to detect the repetitive pattern.

22. The method of claim 19 further comprising:
employing a total observation time of the acquiring the voltage and current waveform;
employing as the state-types a plurality of types of states selected from the group consisting of a spike if a power level of the current cycle is greater than a predetermined value times a power level of an adjacent previous cycle, remains greater than the predetermined value times the power level of the adjacent previous cycle for a number of cycles, and then returns less than the predetermined value times the power level of the adjacent previous cycle; and
employing as the repetitive pattern a recurrent pattern in which repeated sub-sequences of states starting with a number of spike events are observed in the generated state-sequence, and neither the state-duration nor a cycle time of the repetitive pattern is constant through the observed generated state-sequence, and the quantized state-values also vary with time.

23. The method of claim 22 further comprising:
evaluating means and variances of the cycle time to detect the repetitive pattern.

24. The method of claim 10 further comprising:
identifying an operating mode of the corresponding one of the different electric load types.

* * * * *